United States Patent
Nguyen et al.

(10) Patent No.: US 8,369,165 B2
(45) Date of Patent: Feb. 5, 2013

(54) SYNCHRONOUS SIGNAL GENERATING CIRCUIT

(75) Inventors: Nhon Nguyen, Taoyuan County (TW); Phat Truong, Taoyuan County (TW); John Phan, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 238 days.

(21) Appl. No.: 13/029,949

(22) Filed: Feb. 17, 2011

(65) Prior Publication Data

US 2012/0212273 A1 Aug. 23, 2012

(51) Int. Cl.
*G11C 7/00* (2006.01)

(52) U.S. Cl. ............ 365/194; 365/222; 365/233.1; 365/233.13; 327/142; 327/158

(58) Field of Classification Search .......... 365/222, 365/233.1, 233.13, 194; 327/142, 158
See application file for complete search history.

(56) References Cited

U.S. PATENT DOCUMENTS

| 6,876,239 | B2 * | 4/2005 | Bell ............... 327/158 |
| 8,144,530 | B2 * | 3/2012 | Kim et al. ........ 365/194 |
| 2005/0052910 | A1 * | 3/2005 | Bell ............... 365/194 |
| 2008/0080272 | A1 * | 4/2008 | Jang .............. 365/194 |
| 2009/0322387 | A1 * | 12/2009 | Jang et al. ....... 327/151 |

* cited by examiner

*Primary Examiner* — Pho M Luu
*Assistant Examiner* — Thao Bui

(57) ABSTRACT

A synchronous signal generating circuit. The synchronous signal generating circuit includes a delay locked loop (DLL), an emulator and a multiplexer. The DLL is operative to delay a reference clock signal according to a count value to generate a first output clock signal. The count value is generated according to phase difference between the first output clock signal and the reference clock signal. The emulator is operative to provide a function of the DLL and includes a programmable delay line which is operative to receive the reference clock signal and a reference count value, wherein the reference clock signal is delayed according to the reference count value to generate a second output clock signal. The multiplexer is operative to receive the first and second output clock signal and selectively output the first or second output clock signal. The first output clock signal is outputted in a first mode and the second output clock signal is outputted in a second mode.

14 Claims, 2 Drawing Sheets

SYNCHRONOUS SIGNAL GENERATING CIRCUIT

BACKGROUND OF THE INVENTION

1. Field of the Invention

The invention relates to a synchronous signal generating circuit, and more particularly to a synchronous signal generating circuit of a memory device.

2. Description of the Related Art

A Synchronous Dynamic Random Access Memory (SDRAM) component is a high-density, solid-state, volatile, digital data storage device. Operations of an SDRAM device is that all timing related signals, such as applied control signals, output signals, data bits in both read and write operations, operate in synchronous with the clock signal applied to the device. This feature simplifies the control of memory or system operations and allows the system operating in higher frequencies and provides higher throughput than conventional DRAMs. Synchronizing the memory operation with a clock signal is even more critical for Double Data Rate (DDR) SDRAM components, which provide data and control signal transitions on both the rising and falling edges of the clock signal.

One example signal in a synchronous SDRAM system is a data strobe signal. It is a signal used in write and read operations. Data strobe signal is provided as an input to an SDRAM device when writing data to it. Data strobe signal is synchronized with the clock signal for latching data to be written into the memory device. Conversely, data strobe signal is an output signal generated by the SDRAM when reading data read from it. Data strobe signal is synchronized with the clock signal to latch the data read from the memory.

In a read operation, SDRAM generates data strobe signal synchronously with the clock signal. Ideally, data bits (DQ) and data strobe (DQS) should exhibit little or no skew relative to the applicable clock signal. The degree to which DQ and DQS diverge from synchronicity with the clock signal limits high frequency operations, and is specified by SDRAM manufacturers as DQ output access time (tAC) and DQS output access time (tDQSCK), respectively. One challenge of designing and manufacturing SDRAMs, is to minimize tAC and tDQSCK.

A conventional approach to reduce the skew between the synchronous output signals and the clock signal in an integrated circuit is to use a Delay Locked Loop (DLL). A DLL dynamically adjusts an amount of delay provided by a variable delay line to reduce the phase skew between a synchronous signal which is generated by the DLL and an input clock signal. The current DDR4 Task Group (TG) and Joint Electron Devices Engineering Council (JEDEC) have proposed a new feature called DLL Control Mode. This feature allows enabling or disabling DLL blocks during a self-refresh mode to save power and improve performance. However, there is an issue with one of the key timing parameter tDQSCK to vary unpredictable during the DLL off mode. In the DLL off mode the min/max timing on tDQSCK is unpredictable. Therefore, a novel circuit structure to maintain optimized timing of the tDQSCK is highly required.

BRIEF SUMMARY OF THE INVENTION

A synchronous signal generating circuit and a memory device is provided. An exemplary embodiment of a synchronous signal generating circuit comprises a delay locked loop (DLL), an emulator and a multiplexer. The DLL is operative to delay a reference clock signal according to a count value to generate a first output clock signal. The count value is generated according to a phase difference between the first output clock signal and the reference clock signal. The emulator is coupled to the DLL and operative to provide a function of the DLL and comprises a programmable delay line operative to receive the reference clock signal and a reference count value, wherein the reference clock signal is delayed according to the reference count value to generate a second output clock signal. The multiplexer is operative to receive the first and second output clock signal and selectively output the first or second output clock signal. The first output clock signal is outputted in a first mode and the second output clock signal is outputted in a DLL second mode.

Another embodiment of a memory device comprises a memory array, a control logic and a synchronous signal generating circuit. The control logic is arranged to control read and write operations of the memory array. The synchronous signal generating circuit is arranged to receive a reference clock signal and operative to generate an output clock signal having rising/falling edges aligned with the reference clock signal, wherein the memory array is operated according to the output clock signal. The synchronous signal generating circuit comprises a delay locked loop (DLL) and an emulator. The DLL is operative to delay the reference clock signal according to a count value to generate a first output clock signal as the output clock signal in a first mode. The count value is generated according to a phase difference between the first output clock signal and the reference clock signal. The emulator is operative to provide a function of the DLL when the DLL is in a second mode. The emulator comprises a programmable delay line, operative to receive the reference clock signal and a reference count value, wherein the reference clock signal is delayed according to the reference count value to generate an emulated output clock signal as the output clock signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
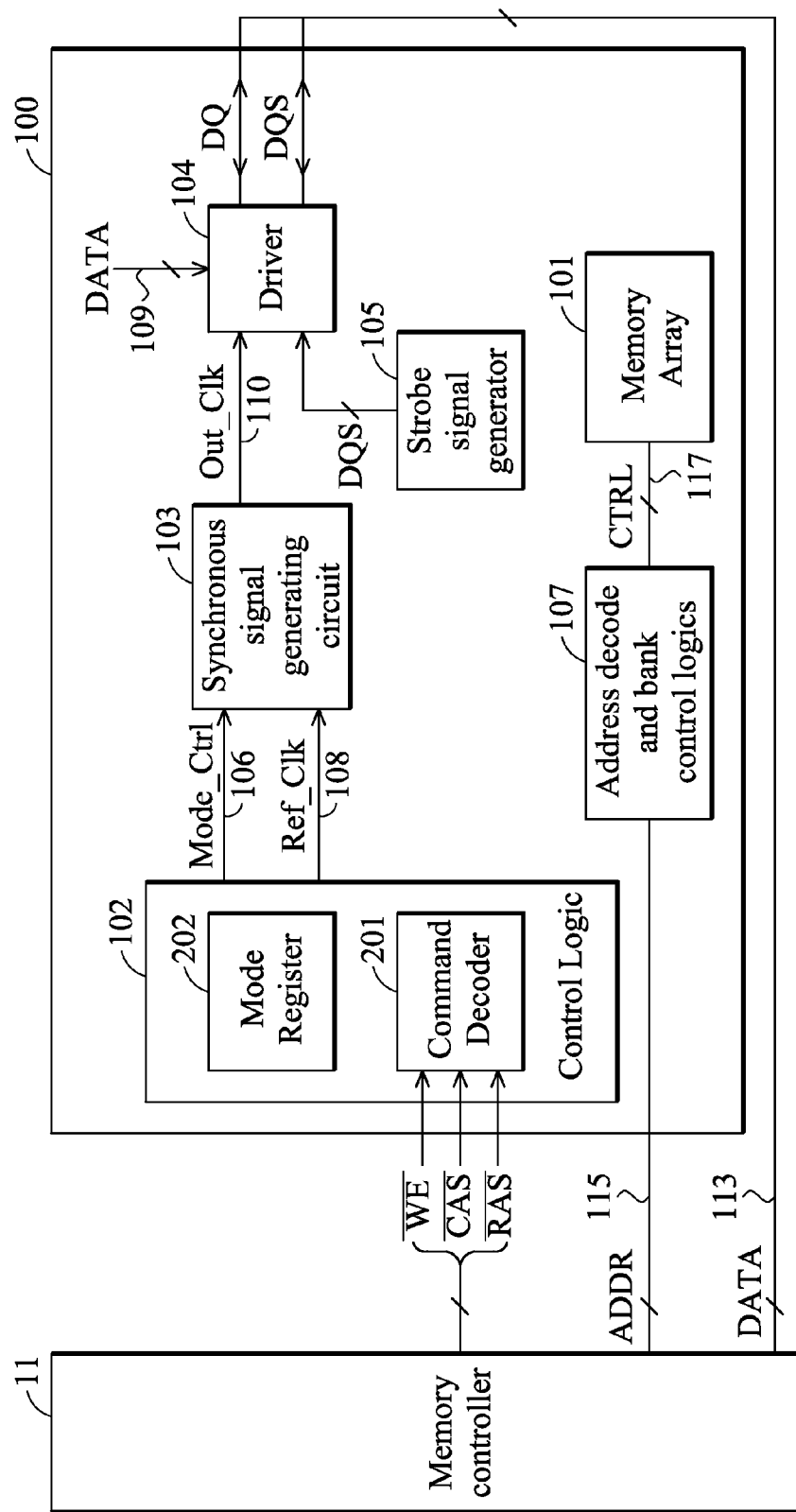
FIG. 1 is a schematic block diagram illustrating a memory device according to an exemplary embodiment of the invention.

FIG. 1 is a schematic block diagram illustrating a memory device according to an embodiment of the invention. In order to clarify the concept of the invention, FIG. 1 presents a simplified block diagram, in which only the elements relevant to the invention are shown. However, note that the invention should not be limited what is shown on the FIG. 1. Memory device 100 comprises a memory array 101, a control logic 102, a synchronous signal generating circuit 103, a driver 104, a strobe signal generator 105 and a bank control logics 107. Memory array 101 is arranged to store data. The memory controller 11 applies addresses to the address decode and bank control logics 107 over an address bus ADDR 115 connected therebetween. The address decode and bank control logics 107 comprises at least an address decode logic, a bank control logic, and the corresponding logic circuits. The address decode and bank control logics 107 decodes the received addresses, and applies a plurality of control signals CTRL 117 to the memory array 101 according to the decoded addresses. Control logic 102 is arranged to control read and write operations of memory array 101. Control logic 102 may further comprise a command decoder 201 and a mode register 202. Command decoder 201 decodes a plurality of signals received from a memory controller 11. The signals include at least a Write Enable (/WE), a Column Address Strobe (/CAS) and a Row Address Strobe (/RAS) as shown. Control logic 102 generates a plurality of mode control signals (represented here as Mode_Ctrl 106 shown in FIG. 1). Control logic 102 stores mode control signals in mode register 202 for controlling operations of memory device 100. Synchronous signal generating circuit 103 is arranged to align rising/falling or leading/trailing edges of synchronous output signals with input reference clock signal Ref_Clk 108 to reduce skew between synchronous output signal and input reference clock signal Ref_Clk 108. Synchronous signal generating circuit 103 further receives mode control signals Mode_Ctrl and operates according to mode control signals Mode_Ctrl (which will be discussed in more detail in following paragraphs). Driver 104 is arranged to drive data bits (DQ) and data strobe signal (DQS) based on synchronous output signal Out_Clk 110 generated by synchronous signal generating circuit 103. The driver 104 sequentially receives the data from a multiplexer (not shown) via the data bus 109, a data strobe signal DQS from a strobe signal generator 105 and a synchronous output signal Out_Clk 110 from the synchronous signal generating circuit 103. The data strobe signal DQS has the same frequency as the input reference clock signal Ref_Clk 108 and is used by the memory controller 11 in latching data from the memory device 100 during read operations. In response to the synchronous output signal Out_Clk 110, the driver 104 sequentially outputs the received data as corresponding data bits DQ that, in a dual data rate (DDR) configuration, and also outputs the data strobe signal DQS. Each data bit DQ and the data strobe signal DQS collectively define a data bus 113 coupled to the memory controller 11 which, during read operations, latches the each bit on the data bus 113 responsive to the data strobe signal DQS. Driver 104 comprises a latch (not shown), which uses the rising/falling or leading/trailing edges of synchronous output signal generated by synchronous signal generating circuit 103 to latch data bits to DQ signal and data strobe signal DQS to the strobe I/O signal. In this manner, memory array 101 is operated based on synchronous output signal with little or no skew relative to the clock signal applied to the memory array 101.

Figure 2:
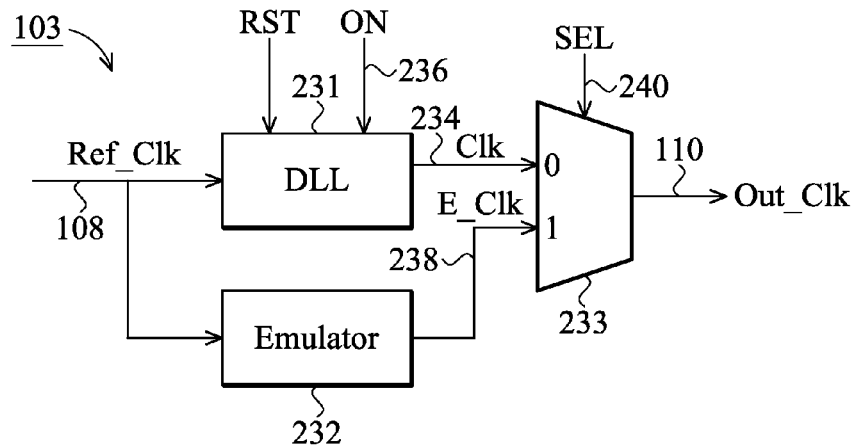
FIG. 2 is a schematic diagram showing a synchronous signal generating circuit according to an exemplary embodiment of the invention.

FIG. 2 is a schematic diagram showing a synchronous signal generating circuit 103 according to an exemplary embodiment of the invention. Synchronous signal generating circuit 103 comprises a delay locked loop (DLL) 231, an emulator 232 and a multiplexer 233. DLL 231 is generally enabled in a normal mode and is arranged to delay the reference clock signal Ref_Clk 108 according to a count value and operative to generate a first output clock signal Clk 234. DLL 231 may be enabled in response to an enabled ON signal 236 as shown. In this exemplary embodiment of the invention, the normal mode may represent any mode of the memory device in which DLL 231 is enabled, such as a DLL enable mode.

Contrary to the normal mode, memory device 100 may also be operated in other modes where DLL 231 is disabled or bypassed, such as a DLL off mode or DLL bypass mode. Conventionally, when the DLL 231 is disabled or bypassed (for example, when memory device is in a self refresh mode, the external clock is off and the DLL is, therefore, off), the tDQSCK(max) and tDQSCK(min) becomes unpredictable, forcing the memory controller to determine the beginning of the "valid" data at the controller's side. The tDQSCK(max) and tDQSCK(min) are the maximum and minimum window times for an access of DQS from a clock (CK) crossover. To solve this problem, an emulator 232 is proposed, which is used in the synchronous signal generating circuit. Emulator 232 is arranged to emulate a function of DLL 231 in a DLL off/bypass mode, where the DLL off/bypass mode here may represent any mode of the memory device in which DLL 231 is disabled or bypassed, such as the DLL off mode or DLL bypass mode referred to above. Emulator 232 delays the reference clock signal Ref_Clk 108 according to a reference count value and operative to generate an emulated output clock signal E_Clk 238 as output clock signal Out_Clk 110 generated by synchronous signal generating circuit 103.

Multiplexer 233 receives the first output clock signal Clk 234 and the emulated output clock signal E_Clk 238, and selectively outputs the first or emulated output clock signal as the output clock signal Out_Clk 110 according to a selection signal SEL 240. According to an exemplary embodiments of the invention, the selection signal SEL 240 may be generated according to a logical combination of some of the mode control signals Mode_Ctrl 106. For example, the selection signal SEL 240 may be a logical AND result of a DLL bypass signal and a fast exit self-refresh SRF indication signal, wherein the DLL bypass signal indicates that the DLL has to be bypassed, and the fast exit SRF signal indicates that the memory device has to fast exit a self refresh mode. According to the status of the selection signal SEL 240, multiplexer 233 may output the first output clock signal CLK 234 generated by the DLL 231 in a normal mode, and output the emulated output clock signal E_Clk 238 generated by the emulator 232 in a DLL off/bypass mode.

Figure 3:
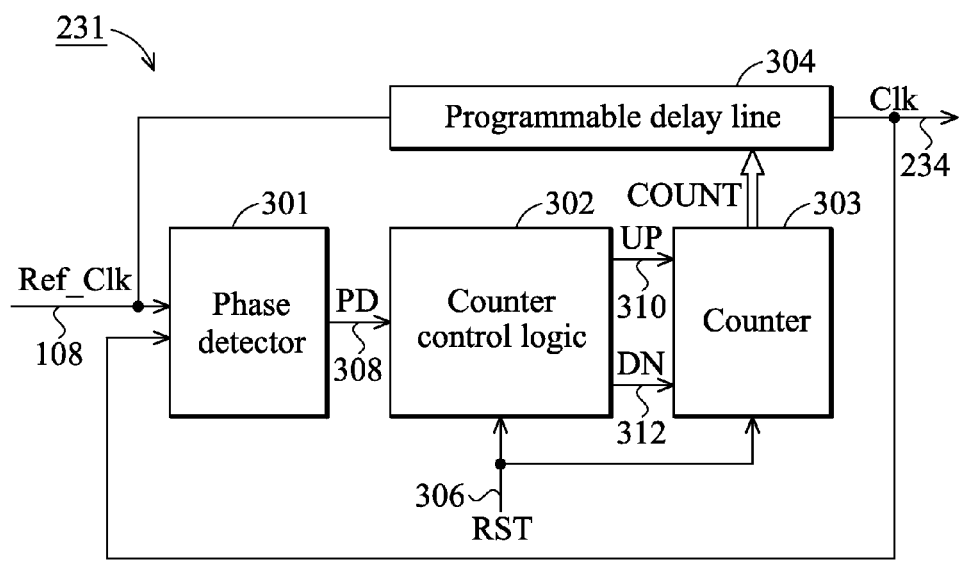
FIG. 3 is a schematic diagram depicting a DLL according to an exemplary embodiment of the invention.

FIG. 3 is a schematic diagram illustrating a DLL 231 according to an exemplary embodiment of the invention. DLL 231 comprises a phase detector 301, a counter control logic 302, a counter 303 and a programmable delay line 304. Phase detector 301 determines the phase relationship between the reference clock signal Ref_Clk 108 and the output clock signal Clk 234 and operative to generate signals PD 308 responsive to the phase difference between the reference clock signal Ref_Clk 108 and the output clock signal Clk 234. Counter control logic 302 generates control signals UP 310 or DN 312 to control counter 303 to count up or down according to signals received from phase detector 301. Counter 303 maintains a count value COUNT in response to control signals received from counter control logic 302. Counter 303 may further receive a reset indication signal RST 306 and may be reset to the default setting based on the reset indication signal RST 306. There are a number of different modes that would trigger a reset to DLL 231; for example, a self refresh SRF or a power down mode. Programmable delay line 304 is arranged to provide a delay to the reference clock signal Ref_Clk 108 according to count value COUNT, so as to generate output clock signal Clk 234.

Figure 4:
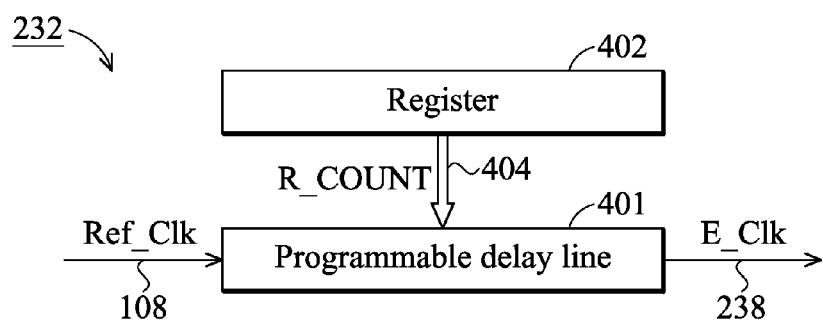
FIG. 4 is a schematic diagram illustrating an emulator circuit according to an embodiment of the invention.

FIG. 4 is a schematic diagram illustrating an emulator circuit 232 according to an exemplary embodiment of the invention. Emulator 232 comprises a programmable delay line 401 and a register 402. Programmable delay line 401 receives reference clock signal Ref_Clk 108 and a reference count value R_COUNT from register 402, and provides a delay on the reference clock signal Ref_Clk 404 according to the reference count value R_COUNT 404 and operative to generate the emulated output clock signal E_Clk 238. According to an exemplary embodiment of the invention, register 402 is coupled to DLL 231, receives a current count value of the DLL 231 and stores the current count value as a reference count value R_COUNT. Note that the count value of the DLL 231 is not always updated to the register 402. According to the embodiments of the invention, when the memory device enters a self refresh mode or a DLL reset mode, an update procedure will be enabled. For example, register 402, is updated with the current count value of the DLL 231, in response to a self refresh enter mode indication signal, wherein self refresh enter mode indication signal indicates that the memory device has to enter a self refresh mode to refresh the memory array for retaining data stored therein. As another example, the register 402 is updated with the current count value of DLL 231 in response to a DLL reset indication signal, wherein the DLL reset indication signal indicates that memory device has to enter a DLL reset mode to reset DLL 231. Note that according to another aspect of the invention, programmable delay line 401 may be disabled in normal mode according to a corresponding control signal. Such control signal may also be generated according to a logical combination of some of the mode control signals Mode_Ctrl.

Via the emulator circuit 232, a current count value from a previous lock of the DLL 231 may be stored in register 402 before DLL 231 is disabled or bypassed, and programmable delay line 401 may be utilized to keep reference clock signal Ref_Clk going through the same delay amount when DLL 231 is disabled or bypassed. Therefore, even when the memory device enters self refresh mode or DLL bypass mode, accurate emulated output E_Clk 238, with less tDQSCK timing jitter, may still be outputted. Due to accurate tDQSCK timing, a user may perform a read or write operation even when DLL bypass is enabled and does not have to wait for DLL to relock in order to perform these operations. Also, at the same time, memory controller may further issue more read or write commands into the memory device, so as to increase throughput and improve the performance of the memory device.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A synchronous signal generating circuit of a memory device, comprising:
   a delay locked loop (DLL), operative to delay a reference clock signal according to a count value to generate a first output clock signal, wherein the count value is generated according to a phase difference between the first output clock signal and the reference clock signal;
   an emulator, coupled to the DLL and operative to provide a function of the DLL, comprising:
      a programmable delay line, operative to receive the reference clock signal and a reference count value, wherein the reference clock signal is delayed according to the reference count value to generate a second output clock signal; and
   a multiplexer, operative to receive the first output clock signal and the second output clock signal and selectively output the first or second output clock signal,
   wherein the first output clock signal is outputted in a first mode and the second output clock signal is outputted in a second mode.

2. The synchronous signal generating circuit as claimed in claim 1, wherein the emulator further comprises a register coupled to the DLL for storing a current count value of the DLL as the reference count value.

3. The synchronous signal generating circuit as claimed in claim 2, wherein the current count value of the DLL is updated to the register in response to a self refresh enter mode indication signal, and wherein the self refresh enter mode indication signal indicates that the memory device has to enter a self refresh mode.

4. The synchronous signal generating circuit as claimed in claim 2, wherein the current count value of the DLL is updated to the register in response to a DLL reset indication signal, and wherein the DLL reset indication signal indicates that the DLL has to be reset.

5. The synchronous signal generating circuit as claimed in claim 1, wherein the programmable delay line is disabled in the first mode.

6. The synchronous signal generating circuit as recited in claim 1, wherein the second mode is a DLL off mode.

7. The synchronous signal generating circuit as recited in claim 1, wherein the second mode is a DLL bypass mode.

8. A memory device, comprising:
   a memory array;
   a control logic, arranged to control read and write operations of the memory array; and
   a synchronous signal generating circuit, arranged to receive a reference clock signal and operative to generate an output clock signal having rising/falling edges aligned with the reference clock signal, wherein the memory array is operated according to the output clock signal, and the synchronous signal generating circuit comprises:
      a delay locked loop (DLL), operative to delay the reference clock signal according to a count value to generate a first output clock signal as the output clock signal in a first mode, wherein the count value is generated according to a phase difference between the first output clock signal and the reference clock signal; and
      an emulator, operative to provide a function of the DLL when the DLL is in a second mode, and the emulator comprises:
         a programmable delay line, operative to receive the reference clock signal and a reference count value, wherein the reference clock signal is delayed according to the reference count value to generate an emulated output clock signal as the output clock signal.

9. The memory device as claimed in claim 8, wherein the emulator further comprises a register coupled to the DLL for storing a current count value of the DLL as the reference count value.

10. The memory device as claimed in claim 8, wherein the synchronous signal generating circuit further comprises:

a multiplexer, operative to receive the first output clock signal and the emulated output clock signal, and selectively output the first or emulated output clock signal as the output clock signal.

11. The memory device as claimed in claim 9, wherein the current count value of the DLL is updated to the register in response to a self refresh enter mode indication signal, and wherein the self refresh enter mode indication signal indicates that the memory array has to be refreshed.

12. The memory device as claimed in claim 9, wherein the current count value of the DLL is updated to the register in response to a DLL reset indication signal, and wherein the DLL rest indication signal indicates that the DLL has to be reset.

13. A memory device as recited in claim 8, where the second mode is a DLL off mode.

14. A memory device as recited in claim 8, where the second mode is a DLL bypass mode.

* * * * *